United States Patent [19]

Uehara et al.

[11] Patent Number: 5,083,896
[45] Date of Patent: Jan. 28, 1992

[54] OBJECT HANDLING DEVICE

[75] Inventors: Akira Uehara; Isamu Hijikata; Mitsuaki Minato, all of Kanagawa, Japan

[73] Assignee: Tokyo Ohka Kogyo Co., Ltd., Kawasaki, Japan

[21] Appl. No.: 406,796

[22] Filed: Sep. 13, 1989

[30] Foreign Application Priority Data

Sep. 16, 1988 [JP] Japan .................. 63-232077

[51] Int. Cl.$^5$ ............................. B25J 11/00
[52] U.S. Cl. ................... 414/744.5; 74/479; 901/8; 901/21; 901/24
[58] Field of Search ...... 414/744.5, 736, 217; 901/8, 15, 21, 23, 24; 198/474.1, 476.1; 74/479

[56] References Cited

U.S. PATENT DOCUMENTS

| | | | |
|---|---|---|---|
| 4,626,013 | 12/1986 | Barrows | 414/736 X |
| 4,813,846 | 3/1989 | Helms | 901/15 X |
| 4,897,015 | 1/1990 | Abbe et al. | 901/21 |

FOREIGN PATENT DOCUMENTS

| | | | |
|---|---|---|---|
| 58-60552 | 11/1983 | Japan . | |
| 222906 | 9/1987 | Japan | 414/277 |
| 1041282 | 9/1983 | U.S.S.R. | 901/21 |

Primary Examiner—Robert J. Spar
Assistant Examiner—Donald W. Underwood
Attorney, Agent, or Firm—Merchant, Gould, Smith, Edell, Welter & Schmidt

[57] ABSTRACT

An object handling device successively transfers objects such as semiconductor wafers. The object handling device includes first and second collapsible arm units having hands for holding objects, a first drive shaft for selectively extending and contracting the first arm unit, a second drive shaft for selectively extending and contracting the second arm unit, a third drive shaft for turning the first and second arm units while keeping the first and second arm units in a relative positional relationship, the first, second, and third drive shafts being disposed coaxially with each other, and an actuator mechanism for angularly moving the first, second, and third drive shafts about their own axes independently of each other.

8 Claims, 7 Drawing Sheets

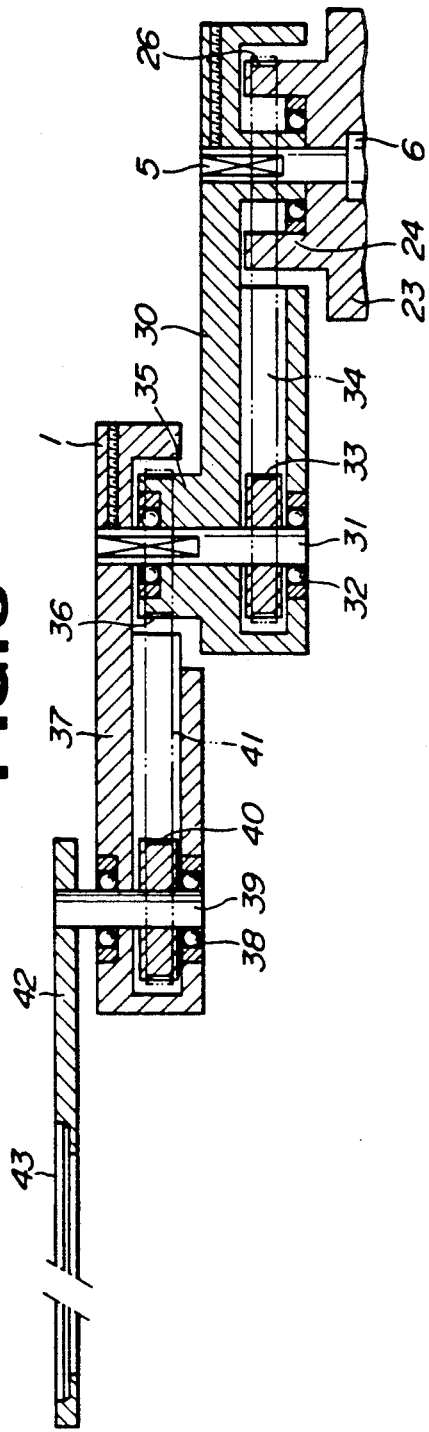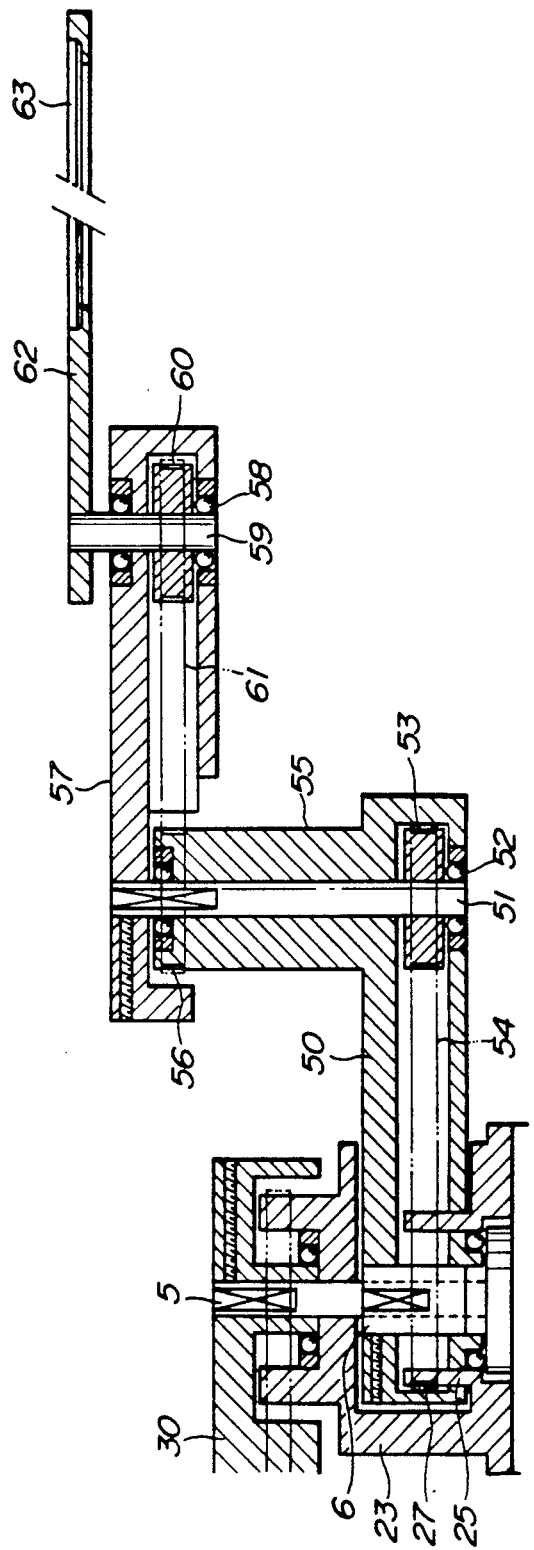

OBJECT HANDLING DEVICE

BACKGROUND OF THE INVENTION

1. Field of the Invention

The present invention relates to an object handling device for transferring objects such as semiconductor wafers.

2. Description of the Relevant Art

One known mechanism for transferring semiconductor wafers between the processing chamber of a plasma processing apparatus and a cassette which stores wafers is disclosed in Japanese Laid-Open Patent Publication No. 58-60552, for example.

The disclosed mechanism includes first and second feed means comprising belt conveyors which are located between the processing chamber and the cassette. The wafers stored in the cassette are brought one by one onto the belt conveyors, by which the wafers are delivered into the processing chamber. After the wafers have been processed, they are delivered out of the processing chamber and stored back into the cassette.

The conventional mechanism is however problematic in that the entire mechanism would become very complex if the direction of feed of the wafers between the processing chamber and the cassette were to change, and the reverse sides of the wafers are contaminated by dirt on the belt conveyors.

SUMMARY OF THE INVENTION

According to the present invention, there is provided an object handling device comprising a first collapsible arm unit having a hand for holding an object, a second collapsible arm unit having a hand for holding an object, a first drive shaft for selectively extending and contracting the first arm unit, a second drive shaft for selectively extending and contracting the second arm unit, a third drive shaft for turning the first and second arm units while keeping the first and second arm units in a relative positional relationship, the first, second, and third drive shafts being disposed coaxially with each other, and an actuator mechanism for angularly moving the first, second, and third drive shafts about their own axes independently of each other.

When motors of the actuator mechanism are energized to rotate the first and second drive shafts in one direction, the first and second arm units are extended to place a hand on a distal end of one of the arm units into a cassette to hold an unprocessed object, such as a semiconductor wafer, and also to position a hand on a distal end of the other arm unit into a processing chamber to hold a processed semiconductor wafer therein. Then, the motors are reversed to rotate the first and second drive shafts in the opposite direction for thereby contracting the first and second arm units. The third drive shaft is also rotated by another motor to switch around the first and second arm units. Thereafter, the first an second arm units are extended to place the processed semiconductor wafer back into the cassette and to feed the unprocessed semiconductor wafer into the processing chamber.

The above and further objects, details and advantages of the present invention will become apparent from the following detailed description of a preferred embodiment thereof, when read in conjunction with the accompanying drawings.

BRIEF DESCRIPTION OF THE DRAWINGS

FIGS. 6 and 7 are enlarged fragmentary cross-sectional views of the arm units.

DETAILED DESCRIPTION OF THE PREFERRED EMBODIMENT

Figure 1:
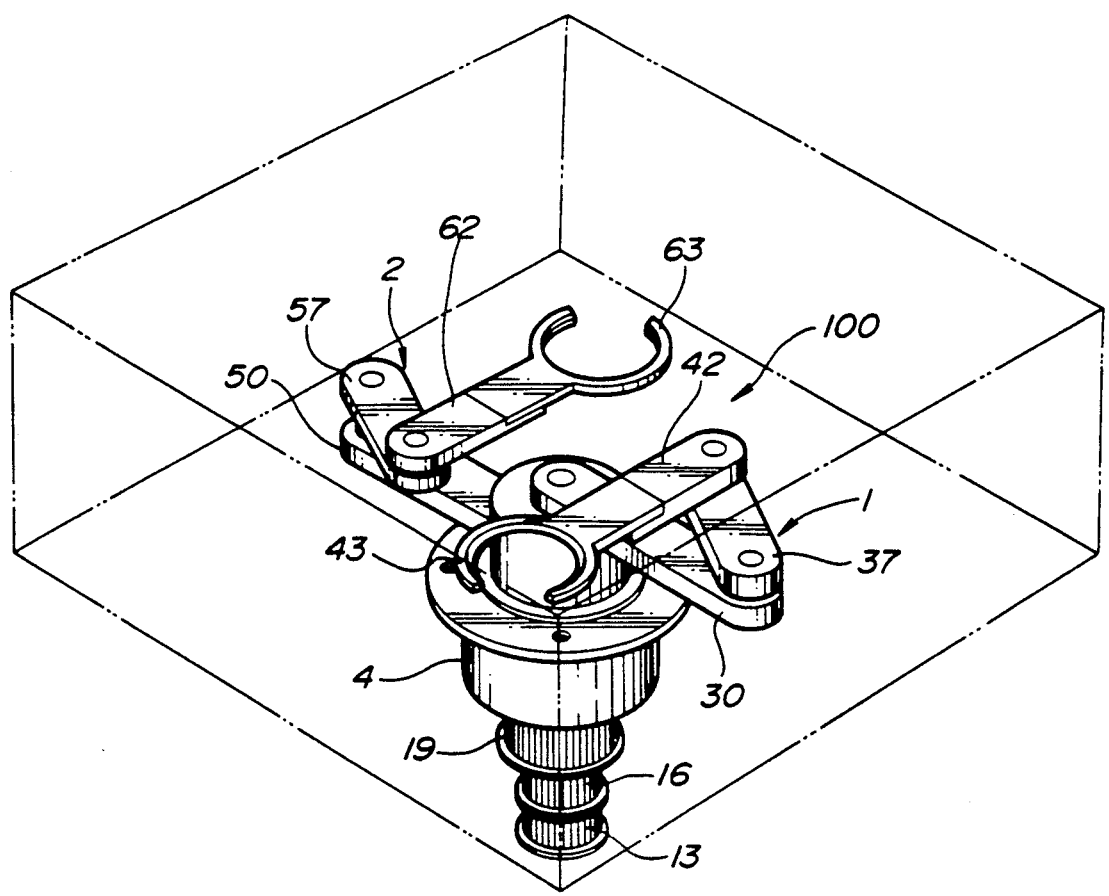
FIG. 1 is a perspective view of an object handling device according to the present invention.

As shown in FIG. 1, an object handling device 100 according to the present invention generally comprises an upper handling mechanism and a lower actuator mechanism. The handling mechanism includes a pair of first and second articulated arm units 1, 2. The actuator mechanism includes drive shafts and motors for extending, contracting, and turning the articulated arm units 1, 2.

Figure 2:
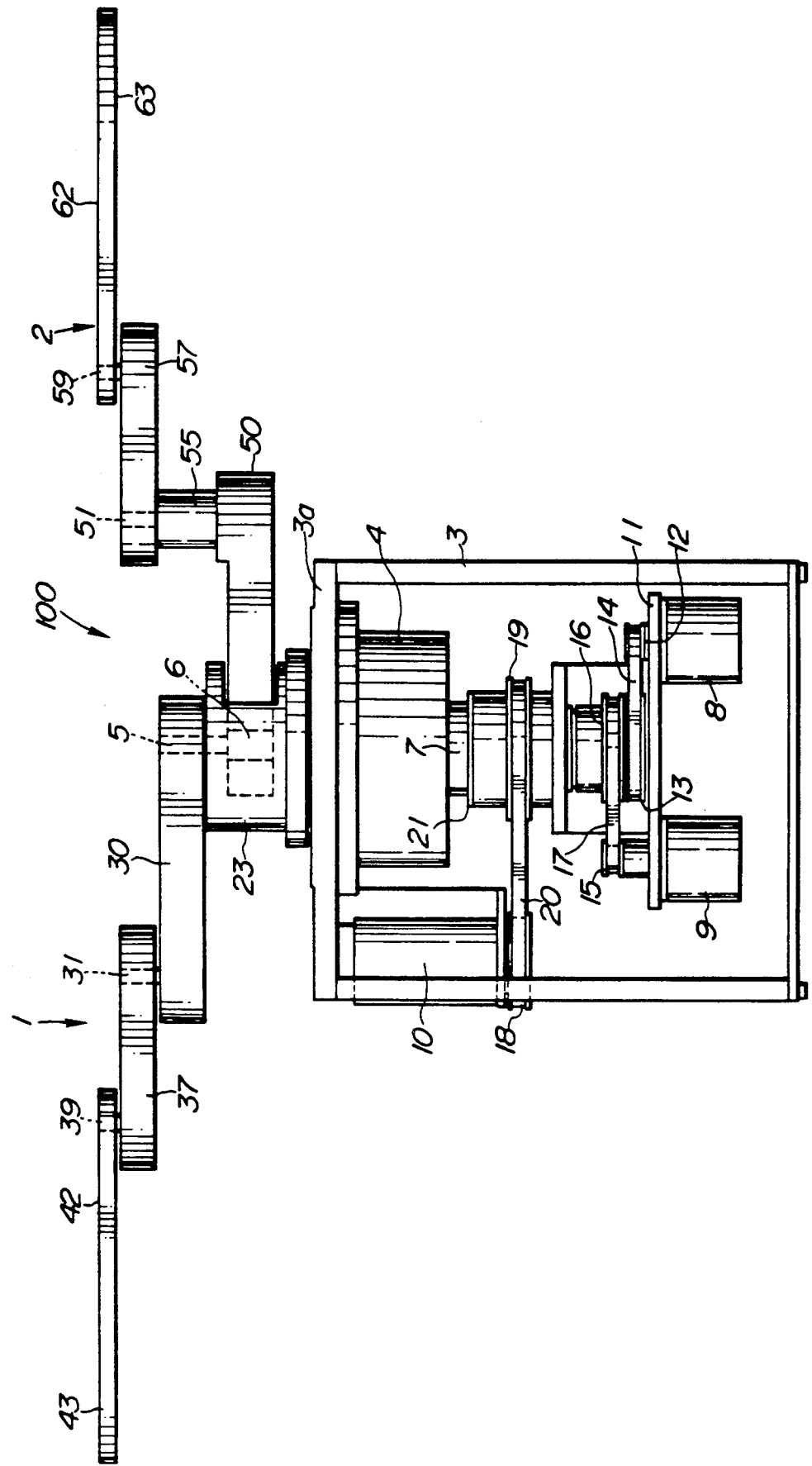
FIG. 2 is an enlarged front elevational view of the object handling device.

As shown in FIG. 2, the object handling device 100 has a frame 3 including an upper panel 3a on which a bearing 4 is fixedly mounted. The actuator mechanism comprises a first drive shaft 5 for moving the first arm unit 1, a second hollow drive shaft 6 for moving the second arm unit 2, the second hollow drive shaft 6 being fitted over the first drive shaft 5, and a third drive shaft 7 for angularly moving the first and second arm units 1, 2 simultaneously, the third drive shaft 7 being fitted over the second drive shaft 6. The first, second, and third drive shafts 5, 6, 7 are coaxially and independently rotatably supported by the bearing 4.

Figure 5:
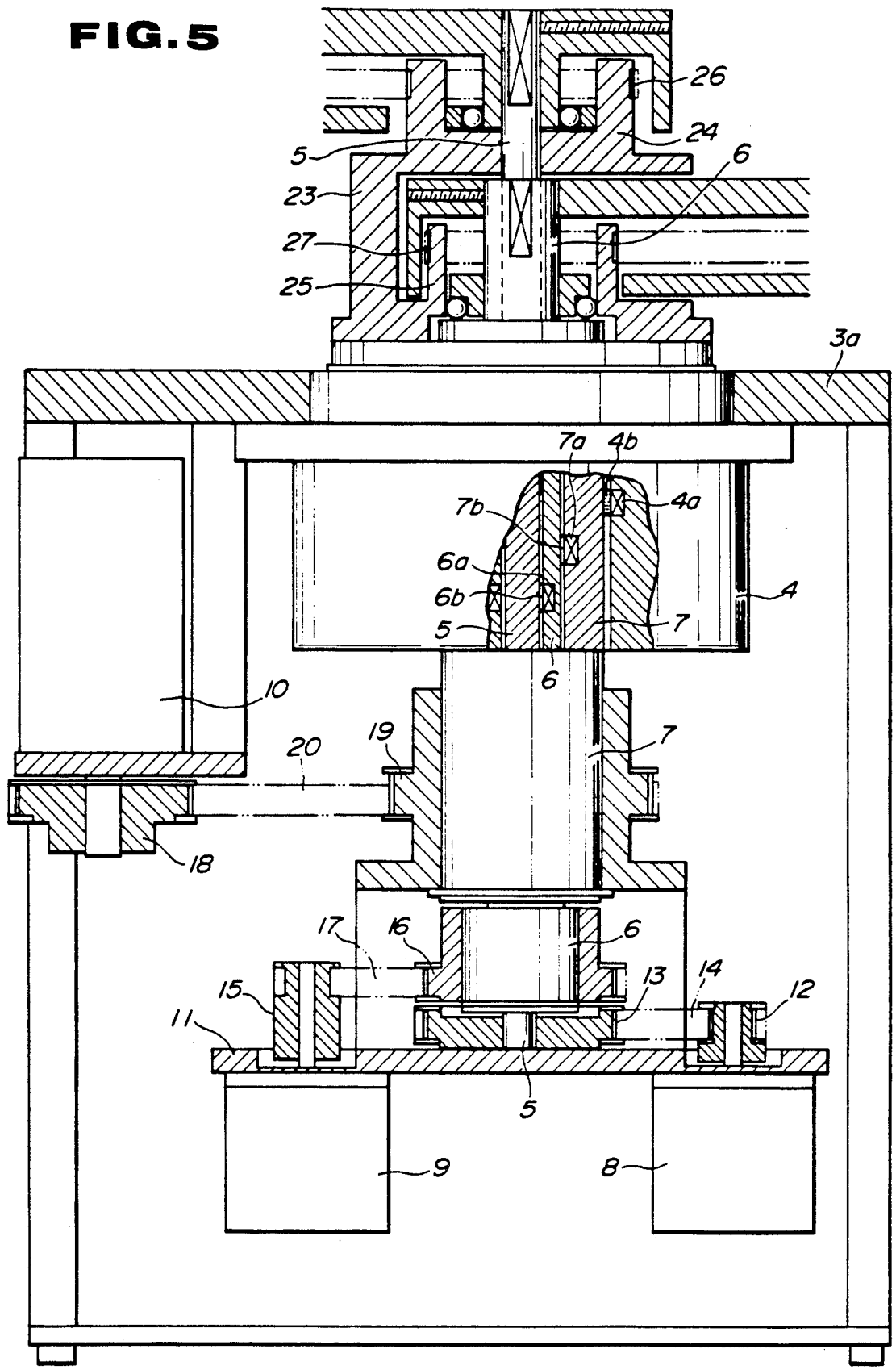
FIG. 5 is an enlarged elevational view, partly in cross section, of an actuator mechanism of the object handling device.

As illustrated in FIG. 5, magnetic fluid seals comprising magnets 4a, 6a, 7a and magnetic fluids 4b, 6b, 7b are disposed between the first, second, and third drive shafts 5, 6, 7, thus hermetically sealing the handling mechanism and the actuator mechanism from each other. Therefore, the handling mechanism may be positioned within a vacuum chamber whereas the actuator mechanism may be positioned outside of the vacuum chamber. While the third drive shaft 7 is in the outermost position, the second drive shaft 6 is located inside of the third drive shaft 7, and the first drive shaft 5 is in the innermost position, these drive shafts may be constructed such that they are located in other positional relationship.

The actuator mechanism comprises a first motor 8 for rotating the first drive shaft 5, a second motor 9 for rotating the second drive shaft 6, and a third motor 10 for rotating the third drive shaft 7. The first and second motors 8, 9 are mounted on a support 11 which is fixed to and rotatable with the third drive shaft 7. Therefore, the first and second motors 8, 9 revolve around the first drive shaft 5 upon rotation of the first drive shaft 5. An antibacklash type timing belt 14 is trained around a toothed pulley 12 fixedly fitted over the output shaft of the first motor 8 and a toothed pulley 13 fixedly fitted over the first drive shaft 5. Likewise, a timing belt 17 is trained around a toothed pulley 15 fixedly fitted over the output shaft of the second motor 9 and a teethed pulley 16 fixedly fitted over the drive shaft 6. A timing belt 20 is trained around a toothed pulley 18 fixedly fitted over the output shaft of the third motor 10 and a toothed pulley 19 fixedly fitted over the third drive shaft 7. Consequently, the rotative forces from the motors 8, 9, 10 are independently transmitted to the corresponding drive shafts 5, 6, 7.

The timing belts and toothed pulleys, illustrated as transmitting means for transmitting the rotative forces from the motors 8, 9, 10 to the respective drive shafts 5, 6, 7, may be any of various other means such as gears.

The first and second arm units 1, 2 will be described in detail with reference to FIGS. 5, 6, and 7.

A case 23 is mounted on the upper end of the third drive shaft 7, and includes upper and lower tubular portions 24, 25 extending coaxially with the third drive shaft 7. The tubular portions 24, 25 have respective toothed pulleys 26, 27 on their outer circumferential surfaces. The first drive shaft 5 has an upper end projecting above the tubular portion 24. As shown in FIG. 6, the first arm unit 1 includes a first hollow arm member 30 having a proximal end mounted on the upper projecting end of the first drive shaft 5. A pivot shaft 31 is rotatably supported on the distal end of the first arm member 30 by a bearing 32. A timing belt 34 is trained around a pulley 33 fixedly fitted over the pivot shaft 31 and the toothed pulley 26 of the tubular portion 24. The distal end of the first arm member 30 has a tubular portion 35 on its upper surface which is held coaxially with the pivot shaft 31. The tubular portion 35 has a toothed pulley 36 on its outer circumferential surface. The pivot shaft 31 has an upper end projecting above the tubular portion 35. A second hollow arm member 37 is attached to the upper projecting end of the pivot shaft 31. A pivot shaft 39 is rotatably supported on the distal end of the second arm member 37 by a bearing 38. A timing belt 41 is trained around a toothed pulley 40 fixedly fitted over the pivot shaft 39 and the toothed pulley 36 of the tubular portion 35. A hand 42 is mounted at its proximal end on the upper end of the pivot shaft 39. The hand 42 has on its distal end a holder 43 having a groove for receiving an object such as a semiconductor wafer, the holder 43 being of a partly annular shape.

The second arm unit 2 is of substantially the same structure as that of the first arm 1. As shown in FIG. 7, the second arm unit 2 has a hollow arm member 50 with its proximal end mounted on the upper end of the second drive shaft 6 which projects above the tubular portion 25. A pivot shaft 51 is rotatably supported on the distal end of the arm member 50 by a bearing 52. A timing belt 54 is trained around a toothed pulley 53 fixedly fitted over the pivot shaft 51 and the toothed pulley 27 of the tubular portion 25. The arm member 50 has an tubular portion 55 on the upper surface of the distal end thereof, the tubular portion 55 having a toothed pulley 56 on its outer circumferential surface. The pivot shaft 51 has an upper end which projects coaxially above the tubular portion 55 and which supports another hollow arm member 57. A pivot shaft 59 is rotatably supported on the distal end of the arm member 57 by a bearing 58. A timing belt 61 is trained around a toothed pulley 60 fixedly fitted over the pivot shaft 59 and the toothed pulley 56 of the tubular potion 55. A hand 62 which as a holder 63 on its distal end is mounted at its proximal end on the upper end of the pivot shaft 59.

Operation of the motors 8, 9, 10 and the arm units 1, 2 will be described below.

First, the first arm unit 1 will be described. The motor 8 is energized to rotate the first drive shaft 5 thereby rotating the arm member 30 in the direction indicated by the arrow a (counterclockwise), for example, in FIG. 3. When the arm member 30 is rotated in the direction indicated by the arrow a, the pulley 26 operates as a sun gear and the pulley 33 as a planet gear to cause the timing belt 34 to run over an interval depending on the angle through which the arm member 30 is angularly moved. The pulley 33 is thus angularly moved clockwise through a certain angle. Since the pulley 33 is turned clockwise, the arm member 37 is angularly moved in the direction indicated by the arrow b (clockwise) in FIG. 3. Upon the angular movement of the arm member 37, the pulley 36 rotates as a sun gear and a pulley 40 as a planet gear, thereby turning the hand 42 in the direction indicated by the arrow c (counterclockwise) in FIG. 3.

The second arm unit 2 operates similarly. More specifically, when the motor 9 is energized to turn the arm member 50 in the direction indicated by the arrow d (counterclockwise), the arm 57 is turned in the direction indicated by the arrow e, and the hand 62 is turned in the direction indicated by the arrow f.

Figure 3:
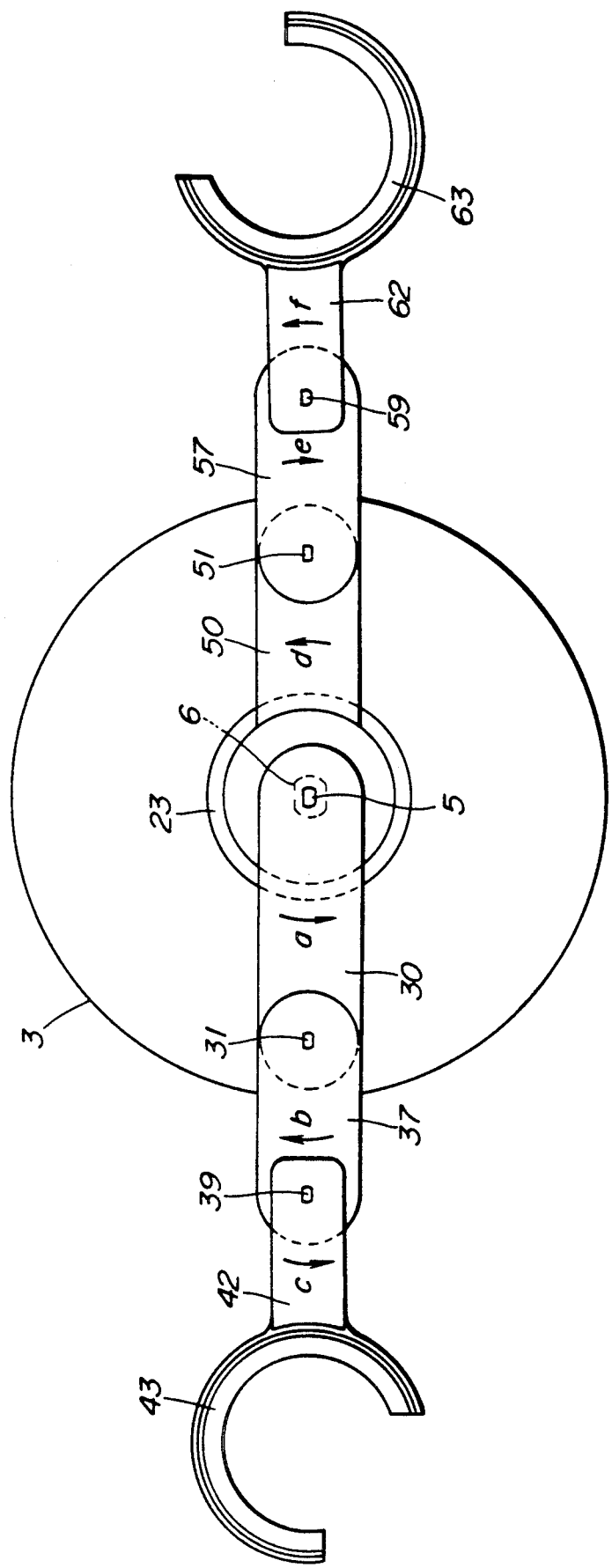
FIG. 3 is a plan view of the object handling device with arm units extended.
Figure 4:
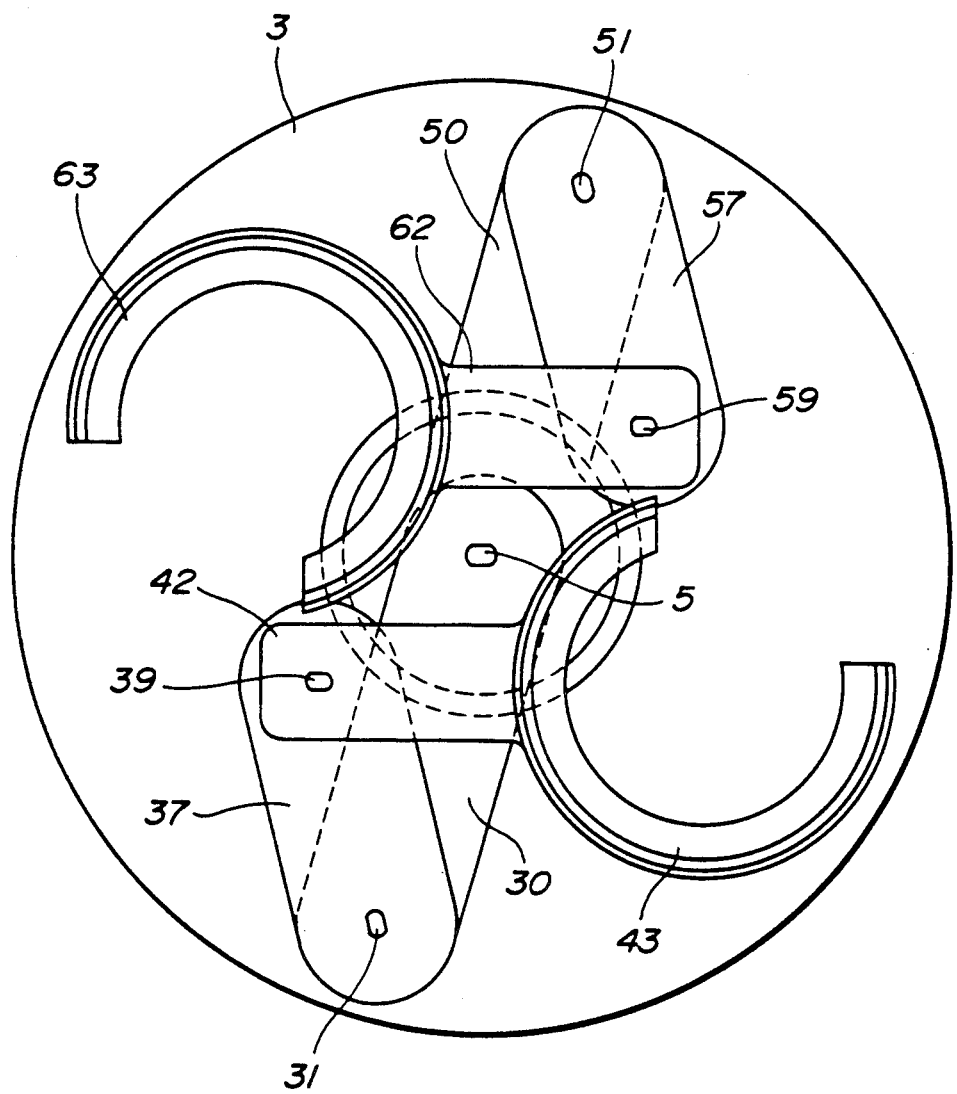
FIG. 4 is a plan view of the object handling device with the arm units contracted.

As a result, the first and second arm units 1, 2 are contracted from an extended position shown in FIG. 3 into a contracted position shown in FIG. 4. The first and second arm units 1, 2 can then be extended into the extended position of FIG. 3 by reversing the motors 8, 9.

When the third motor 10 is energized, the first and second arm units 1, 2 are angularly displaced to another angular position through 180°, for example, within a horizontal plane while keeping themselves in the same relative positional relationship. The above individual and relative movements of the first and second arm units 1, 2 are combined to transfer objects such as semiconductor wafers.

Figure 8:
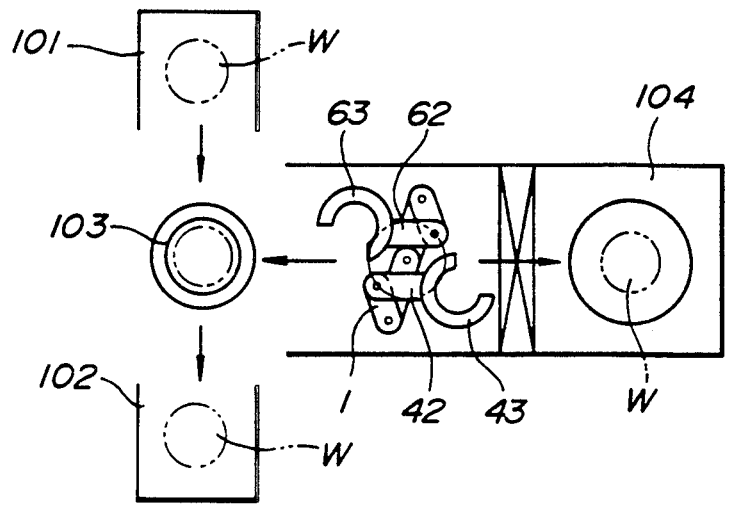
FIGS. 8, 9, and 10 are plan views showing the manner in which the object handling device is used.

FIG. 8 shows a plasma processing apparatus in plan. The plasma processing apparatus includes a cassette 101 for storing unprocessed semiconductor wafers W, a cassette 102 for storing processed semiconductor wafers W, and a transfer table 103 disposed between the cassettes 101, 102. A processing vacuum chamber 104 is positioned on one side of the transfer table 103. The object handling device according to the present invention is placed between the processing chamber 104 and the transfer table 103.

One example of operation of the object handling device will be described with reference to FIG. 8. It is assumed that the holders 43, 63 of the hands 42, 62 of the first arm units 1, 2 are first in the contracted position, without holding wafers W. In operation, the first and second arms 1, 2 are extended from the contracted position. The holder 43 of the first arm unit 1 enters the processing chamber 104 and receives a processed wafer W. At the same time, the holder 63 of the second arm unit 2 receives an unprocessed wafer W which has been delivered from the cassette 101 to the transfer table 103. Then, the first and second arm units 1, 2 are contracted, and angularly moved 180° in the horizontal plane so that they are switched around. Thereafter, the first and second arm units 1, 2 are extended to place the unprocessed wafer W into the processing chamber 104 and also to put the processed wafer W on the transfer table 103. The processed wafer W is then delivered from the transfer table 103 back into the cassette 102, and a new unprocessed wafer W is supplied from the cassette 102 onto the transfer table 103. The above process is repeated to process a succession of semiconductor wafers W.

Figure 9:
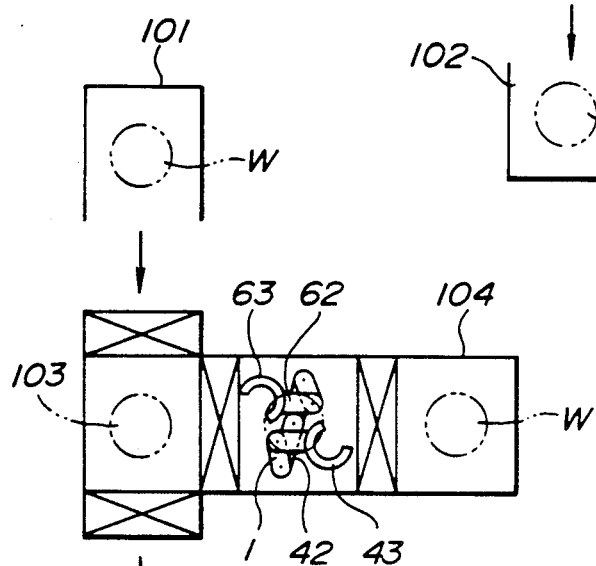
Figure 10:
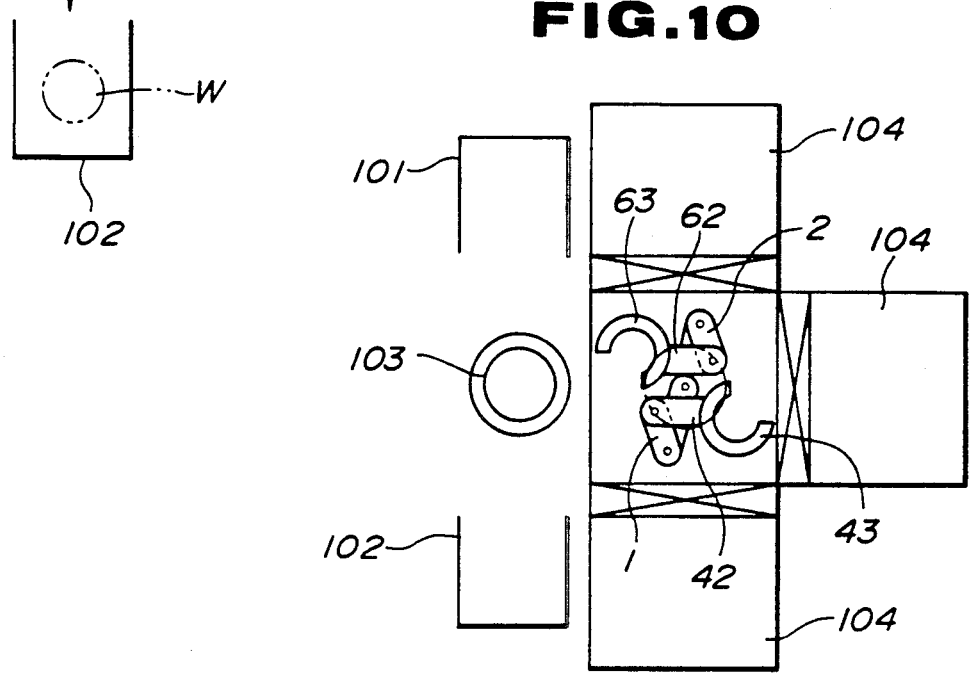

FIG. 9 shows another example of use in which the transfer table 103 is placed in a preliminary vacuum chamber and the object handing device of the invention is positioned in a processing vacuum chamber 104. FIG. 10 illustrates still another example of use in which three processing vacuum chambers 104 are disposed around the object handling device of the present invention.

Even with a plurality of processing chambers 104 employed, objects or semiconductor wafers W can be smoothly transferred by suitably selecting times during which to energize the motors 8, 9, 10, directions in which to rotate the arm members and hands, or ratios of the diameters of the pulleys which are operatively connected by the timing belts.

With the present invention, as described above, the object handling device allows the two arm units to move independently of each other without interfering with each other. Therefore, the object handling device can supply and receive objects efficiently. Inasmuch as the drive shafts for rotating the arm members are disposed coaxially with each other, the entire object handling device is made compact in size.

Although there has been described what is at present considered to be the preferred embodiment of the present invention, it will be understood that the invention may be embodied in other specific forms without departing from the essential characteristics thereof. The present embodiment is therefore to be considered in all aspects as illustrative, and not restrictive. The scope of the invention is indicated by the appended claims rather than by the foregoing description.

We claim:

1. An object handling device comprising:
a frame;
a first collapsible arm unit having a hand for holding an object;
a second collapsible arm unit having a hand for holding an object;
a second collapsible arm unit having a hand for holding an object;
a first drive shaft for selectively extending and contracting said first arm unit;
a second drive shaft for selectively extending and contracting said second arm unit;
a third drive shaft for turning said first and second arm units while keeping the first and second arm units in a relative positional relationship;
said first, second, and third drive shafts being disposed coaxially with each other and said second and third drive shafts being hollow shafts, said first drive shaft being disposed inwardly of said second drive shaft and said second drive shaft being disposed inwardly of said third drive shaft;
a first actuator mechanism for angularly moving said first drive shaft about its own axis with respect to said third drive shaft;
a second actuator mechanism for angularly moving said second drive shaft about its own axis with respect to said third drive shaft; and
a third actuator mechanism for angularly moving said third drive shaft about its own axis with respect to said frame, said first, second, and third actuator mechanism being operable independently of each other;
wherein said first, second, and third actuator mechanisms comprise first, second, and third motors operatively coupled to said first, second, and third drive shafts, respectively, further including a support mounted in the frame and rotatable by said third motor with the third shaft, said first and second motors being mounted on and rotatable with said support.

2. An object handling device according to claim 1, further including magnetic fluid seals disposed hermetically between said first, second, and third drive shafts.

3. An object handling device according to claim 1, wherein each of said first and second arm units comprises a plurality of angularly movably interconnected arm member, each of said hands being attached to a distal end of said arm members.

4. An object handling device according to claim 3, wherein said arm members comprise first and second arm members, said first drive shaft having an upper end fixed to a proximal end of said first arm of said first arm unit, further including a first pivot shaft fixed to a proximal end of said second arm member and rotatably supported on a distal end of said first arm member, a first pulley disposed coaxially on and rotatable with said third drive shaft, a second pulley fixedly fitted over said first pivot shaft, and a timing belt trained around said first pulley, whereby when said first drive shaft is rotated, said first pulley rotates as a sun gear and aid second pulley as a planet gear to rotate said second arm member for thereby selectively extending and contracting said first arm unit.

5. An object handling device according to claim 2, further including a second pivot shaft fixed to a proximal end of said hand and rotatably supported on a distal end of said second arm member, a third pulley disposed on the distal end of said first arm member coaxially with said first pivot shaft, a fourth pulley fixedly fitted over said second pivot shaft, and a timing belt trained around said third and fourth pulleys, whereby when said first pivot shaft is rotated, said third pulley rotates as a sun gear and said fourth pulley as a planet gear to rotate said hand for thereby selectively extending and contracting said first arm unit.

6. An apparatus for simultaneously handling a first object and a second object comprising:
(a) a first segmented articulative arm having a first terminal means for holding said first object, said first segmented articulative arm being extendable and foldable in a first reference plane with said first terminal means moving along a first linear path;
(b) a second segmented articulative arm having a second terminal means for holding said second object, said second arm being extendable and foldable parallel to said first reference plane with said second terminal means moving along a second linear path;
(c) first rotary actuator means comprising a first motor coupled to a first shaft disposed about a central axis perpendicular to said first reference plane and coupled to articulate said first segmented articulative arm;
(d) second rotary actuator means comprising a second motor coupled to a second shaft disposed about said central axis concentric about the first shaft and coupled to articulate said second segmented articulative arm; and
(e) third rotary actuator means comprising a third motor coupled to a third shaft concentric about the second shaft and further including support means coupled to both said first and second arms for simultaneously rotating said first and said second arms angularly about said central axis while the relative positional relationship of said first and second terminal means remains fixed; and wherein said support means is coupled to the third shaft at a spaced apart region from the first and second rotary actuator means, the first and second shafts extending through the support means and the first and second motors being mounted on the support means and coupled to the extending portions of the first and second shafts respectively.

7. An apparatus as set forth in claim 6 above, wherein said first and second segmented articulative arms comprise three pivotally coupled serial segments having pulleys at the pivot axes, and belt drive means coupling said segments serially to the associated shaft to control the relative pivoting thereof as the associated actuator shaft is rotated whereby the terminal means move linearly as the arms extend and fold.

8. An apparatus for handling a first disc-shaped object and a second disc-shaped object comprising:
(a) a frame;
(b) a handling mechanism, said handling mechanism including a central case rotatably mounted in the frame about a vertical central axis, a first articulative arm, and a second articulative arm, said arms being above said case and extending outwardly from the central axis at differing angles parallel to a horizontal reference axis for rotation about the vertical central axis;
(c) an actuator mechanism, said actuator mechanism including first, second and third drive means to independently provide rotational drive for said first articulative arm, said second articulative arm and said case;
(d) belt and pulley drive means separately disposed along each of said first and second arms and responsive to relative rotational movement between said third drive means and said first and second drive means respectively, for independently expanding and contracting said first and second articulative arms;
(e) first and second object holding means coupled to said first and second articulative arms respectively;
(f) said first and second articulative arms and belt and pulley drive means being coupled to linearly move said first and second object holding means coplanar with said horizontal reference plane;
(g) first, second and third drive shafts, said drive shafts being coaxial, concentric and coextensive about said central axis and extending above and below the case, said first and second shafts extending outwardly from the upper and lower ends of the third shaft, the upper ends of said first and second shafts being coupled to said first and second arms respectively and the case being coupled to the belt and pulley drive means;
(h) said first, second, and third drive means comprising first, second and third motors, respectively, said first and second motors being mounted in fixed relation to the case within said frame and below said case, said third motor being coupled to said frame and coupled to rotate said case and third shaft; and
(i) means for transferring rotational movement of said first, second and third motors to said first, second and third drive shafts respectively.

* * * * *

UNITED STATES PATENT AND TRADEMARK OFFICE
CERTIFICATE OF CORRECTION

PATENT NO.   :  5,083,896
DATED        :  January 28, 1992
INVENTOR(S)  :  Akira Uehara, et al.

It is certified that error appears in the above-identified patent and that said Letters Patent is hereby corrected as shown below:

Column 1, line 59, "an" should read --and--.

Column 2, line 11, "cross section" should read --cross-section--.

Column 3, line 54, "an" should read --a--.

Column 3, line 64, "as" should read --has--.

Column 5, claim 1, lines 43 and 44, delete "a second collapsible arm unit having a hand for holding an object;".

Column 5, claim 1, line 67, "mechanism" should read --mechanisms--.

Column 6, claim 3, line 15, "member" should read --members--.

Column 6, claim 4, line 28, "aid" should read --said--.

Signed and Sealed this

Tenth Day of August, 1993

Attest:

MICHAEL K. KIRK

*Attesting Officer*    *Acting Commissioner of Patents and Trademarks*